(12) United States Patent
Govoreanu

(10) Patent No.: US 9,595,668 B2
(45) Date of Patent: Mar. 14, 2017

(54) SELF-RECTIFYING RRAM ELEMENT

(71) Applicant: IMEC vzw, Leuven (BE)

(72) Inventor: Bogdan Govoreanu, Hulshout (BE)

(73) Assignee: IMEC vzw, Leuven (BE)

(*) Notice: Subject to any disclaimer, the term of this patent is extended or adjusted under 35 U.S.C. 154(b) by 102 days.

(21) Appl. No.: 14/306,116

(22) Filed: Jun. 16, 2014

(65) Prior Publication Data
US 2014/0367631 A1 Dec. 18, 2014

(30) Foreign Application Priority Data

Jun. 14, 2013 (EP) .................................... 13172187

(51) Int. Cl.
H01L 45/00 (2006.01)
H01L 27/24 (2006.01)
G11C 13/00 (2006.01)

(52) U.S. Cl.
CPC .......... H01L 45/12 (2013.01); G11C 13/0002 (2013.01); H01L 27/2418 (2013.01); H01L 45/08 (2013.01); H01L 45/1233 (2013.01); H01L 45/146 (2013.01)

(58) Field of Classification Search
CPC ..... H01L 45/12; H01L 45/1233; H01L 45/08; H01L 27/2418; H01L 45/146; G11C 13/0002
See application file for complete search history.

(56) References Cited

U.S. PATENT DOCUMENTS

| | | | | |
|---|---|---|---|---|
| 5,189,503 A | * | 2/1993 | Suguro et al. | 257/310 |
| 7,507,629 B2 | * | 3/2009 | Lucovsky et al. | 438/261 |
| 8,766,234 B1 | * | 7/2014 | Hashim et al. | 257/4 |
| 8,853,099 B2 | * | 10/2014 | Wang et al. | 438/775 |

(Continued)

OTHER PUBLICATIONS

William M. Haynes, CRC Handbook of Chemistry and Physics, 2014-2015, CRC Press, 95th edition, Section 12.*

(Continued)

*Primary Examiner* — Yu Chen
*Assistant Examiner* — Nilufa Rahim
(74) *Attorney, Agent, or Firm* — Knobbe, Martens, Olson & Bear LLP

(57) ABSTRACT

The disclosed technology generally relates to semiconductor devices and more particularly to memory devices having a resistance switching element, and to methods of operating such memory devices. In one aspect, a memory cell includes a first electrode and a second electrode formed of one of a metallic material or a semiconducting material. The memory cell additionally includes a resistance switching element formed between the first electrode and the second electrode. The memory cell additionally includes a tunnel rectifier formed between the resistance-switching element and the first electrode. The tunnel rectifier includes a multi-layer tunnel stack comprising at least two dielectric layers each having a dielectric constant ($k_i$), a conduction band offset ($\Phi_i$), and a thickness, wherein one of the dielectric layers has a higher dielectric constant, a lower conduction band offset and a higher thickness compared to any other dielectric layer of the multi-layer tunnel stack.

20 Claims, 6 Drawing Sheets

(56) References Cited

U.S. PATENT DOCUMENTS

| | | |
|---|---|---|
| 2008/0211036 A1 | 9/2008 | Zhao et al. |
| 2009/0289251 A1 | 11/2009 | Kiyotoshi |
| 2009/0290407 A1 | 11/2009 | Mouli |
| 2010/0163823 A1* | 7/2010 | Sim ............... G11C 11/5685 257/2 |
| 2010/0315857 A1 | 12/2010 | Sonehara et al. |
| 2011/0140068 A1 | 6/2011 | Ozawa et al. |
| 2011/0317470 A1 | 12/2011 | Lu et al. |
| 2012/0001141 A1* | 1/2012 | Hsieh et al. ............... 257/2 |
| 2012/0068137 A1* | 3/2012 | Hwang et al. ............... 257/2 |
| 2012/0074373 A1 | 3/2012 | Ramaswamy et al. |
| 2012/0292584 A1* | 11/2012 | Rocklein et al. ............... 257/2 |
| 2013/0003448 A1* | 1/2013 | Chen et al. ............... 365/158 |
| 2013/0277766 A1* | 10/2013 | Kelwing et al. ............... 257/411 |
| 2014/0042380 A1* | 2/2014 | Kim et al. ............... 257/2 |
| 2014/0183439 A1* | 7/2014 | Hashim et al. ............... 257/5 |
| 2014/0246736 A1* | 9/2014 | Chang et al. ............... 257/411 |
| 2014/0268992 A1* | 9/2014 | Otsuka et al. ............... 365/148 |

OTHER PUBLICATIONS

A.P.Huang, Hafnium-based High-K Gate Dielectrics, Apr. 2010, Advances in Solid State Circuits Technologies, pp. 333-351.*

European Search Report dated Oct. 28, 2013 in European Patent Application No. 13172187.0.

Seo et al. "A ZnO cross-bar array resistive random access memory stacked with heterostructure diodes for eliminating the sneak current effect," *Applied Physics Letters*, vol. 98, 233505, 3 pps. (2011).

Govoreanu et al., "VARIOT: A Novel Multilayer Tunnel Barrier Concept for Low-Voltage Nonvolatile Memory Devices," *IEEE Electron Device Letters*, vol. 24, No. 2, pp. 99-101 (2003).

* cited by examiner

SELF-RECTIFYING RRAM ELEMENT

CROSS-REFERENCE TO RELATED APPLICATIONS

This application claims foreign priority to European patent application EP 13172187.0 filed on Jun. 14, 2013, the content of which is incorporated by reference herein in its entirety.

BACKGROUND OF THE INVENTION

Field of the Invention

The disclosed technology generally relates to semiconductor devices and more particularly to memory devices having a resistance switching element, and to methods of operating such memory devices.

Description of the Related Technology

Resistive random access memory (RRAM) has emerged as one of the most promising non-volatile memory candidates due to its simple structure and its potential for low-power operation. Recently, memory arrays having cross-bar architectures have attracted considerable attention. Memory arrays having cross-bar architectures, sometimes called "cross-bar arrays" or "cross-point arrays," have a first plurality of conductive lines (e.g., bit lines) and a second plurality of conductive lines (e.g., wordlines) that cross the first conductive lines, and a plurality of memory cells formed at the intersections of the first and second conductive lines. Some cross-bar architectures can enable a high density of integrated memory cells. On the other hand, some cross-bar architectures pose several challenges. One of the challenges includes for example, suppressing leakage currents through unselected memory cells during operation of the cross-bar arrays, which can limit the size of the arrays. Another one of the challenges includes crosstalk and interference between memory cells during operation of the arrays.

To reduce the leakage currents through the unselected memory cells during operation, some cross-bar arrays employ selector devices. Such selector devices can be diodes, or more typically transistors. However, while selector devices can reduce leakage currents when included in the cross-bar arrays, some selector devices, such as transistors, can take up device footprint, which can limit the obtainable memory element density, which is a key technological as well as an economic consideration for practical implementation of standalone memory devices. Moreover, such transistor selector increases the complexity of fabrication of the array. In addition, some selector devices, such as semiconductor diodes, may not be able to provide sufficient current density for switching memory elements, which can exceed $1 \times 10^6$ A/cm2

The leakage currents flow through unselected memory cells during operation of the cross-bar arrays that are sometimes called "sneak current path," which refers to the parasitic current path that appears through unselected memory cells when addressing a target selected memory cell in a crossbar memory array. Under some circumstances, such leakage currents can reduce the signal to noise ratio in reading the selected memory cell, which in turn increase the rate of error in reading.

Several self-rectifying (selectorless) cell attempts have been reported, but they exhibit either modest performance or difficult integration.

US2010/0315857 describes a resistance change memory including a first and a second conductive line in a cross bar configuration, a cell unit including a memory element and a rectifying element connected in series between the first and second conductive lines, and a control circuit which is connected to both of the first and second conductive lines. The control circuit controls a voltage to reversibly change a resistance of the memory element between first and second values. The rectifying element is a diode including an anode layer, a cathode layer and an insulating layer therebetween. The MIM diode structure described has the functionality of enabling current in one direction while suppressing it in the other direction. It is a disadvantage of this structure that no bidirectional rectification can be obtained.

US2012/0068137 discloses a switching device including a bipolar tunnelling layer sandwiched in between a first electrode and a second electrode, whereby the bipolar tunnelling layer includes a plurality of dielectric layers having different dielectric constants. It is a disadvantage of the disclosed switching device that it does not provide high enough currents for proper functioning of a memory cell having a resistance switching element.

SUMMARY OF CERTAIN INVENTIVE ASPECTS

It is an object of some of the disclosed embodiments to provide a good self-rectifying (self-selected) resistive random access memory cell. It is an advantage of the disclosed embodiments that the rectifying (selection) function is implemented with a built-in rectifier (diode element).

The above objective is accomplished by a device and method according to the embodiments disclosed herein.

In a first aspect, a memory cell comprises a first electrode and a second electrode, e.g. a bottom electrode and a top electrode, made of conductive or semiconductive material, a resistance switching element in between the first electrode and the second electrode, and a tunnel rectifier in between the resistance-switching element and the first electrode. The tunnel rectifier may be located in between the resistance-switching element and the bottom electrode, or between the resistance-switching element and the top electrode. The tunnel rectifier comprises a multi-layer tunnel stack. The multi-layer tunnel stack comprises a stack of a least two dielectric layers each defined by a dielectric constant and a conduction band offset and a thickness. One of the dielectric layers has a higher dielectric constant, a lower conduction band offset, and a higher thickness than any of the other dielectric layers in the tunnel rectifier stack.

In particular embodiments, the memory cell may be a bipolar memory cell.

In some embodiments, the multi-layer tunnel stack may be a stack of at least three dielectric layers, for example the multi-layer tunnel stack may consist of a stack of exactly three dielectric layers. A dielectric layer sandwiched in between a first and a second neighbouring dielectric layer has a higher dielectric constant on the average as compared to that of the first and second neighbouring dielectric layers, a lower conduction band offset on the average than the first and second neighbouring dielectric layers, and a higher thickness that that of the first and second neighbouring dielectric layers. The first and the second neighbouring dielectric layers may have substantially similar conduction band offsets. With substantially similar is meant a band offset difference of less than 0.5 eV.

In some embodiments, the ratio of the dielectric constant of the first and the second neighbouring layers to the dielectric constant of the dielectric layer sandwiched in between these is at least two. For instance the neighbouring dielectric layers may be made of $SiO_2$ with a dielectric constant of 3.9, and the dielectric layer sandwiched there between may be $Si_3N_4$ with a dielectric constant of 7.8.

In some embodiments, the first neighbouring dielectric layer may be in direct contact with the first electrode. The first electrode may be the bottom electrode or the top electrode.

In a memory cell according to some embodiments, the multi-layer tunnel stack may be a symmetric or nearly symmetric stack, i.e. a stack where the tunnelling properties are similar or the same in both directions. Alternatively, the multi-layer tunnel stack may be an asymmetric stack, i.e. a stack where tunnelling properties substantially differ from one direction to the other. In particular embodiments, a symmetric stack may be not only functionally symmetrical, but also structurally symmetrical. Similarly, an asymmetric stack may be not only functionally asymmetrical, but also structurally asymmetrical.

In this respect, layer thicknesses of neighbouring layers preferably do not differ substantially more than 1 nm in thickness. In principle it is possible to have different materials, with different k-values, for the neighbouring dielectric layer, where thickness and k-value compensate for one another.

In a memory cell according to some embodiments, the dielectric layers in the multi-layer stack may have a thickness below 3 nm each, the thickness of total stack being below 7 nm. In some embodiments, the thickness of the dielectric layer with the higher dielectric constant, for instance the dielectric layer sandwiched in between the first and the second neighboring dielectric layer, may be between 1.8 nm and 3.5 nm, for instance between 2 nm and 3 nm. As particular examples, a multi-layer stack according to some embodiments may comprise three layers having thicknesses of 1.4 nm/2 nm/1.4 nm, or 1.8 nm/3 nm/1.8 nm, respectively.

A dielectric layer of the multi-layer tunnel stack may be in direct contact with any of the resistance-switching element or with an inner conductive layer which is in turn in contact with the resistance-switching element. The inner conductive layer may be adapted for acting as a diffusion barrier to penetration of species responsible for switching of the resistance. The adaptation may comprise providing a material with a low diffusion coefficient for species responsible for the resistive switching, for instance oxygen ions or oxygen vacancies.

At least one of the dielectric layers of the multi-layer tunnel stack, in particular for instance the dielectric layer in direct contact with the resistivity switching element, may be implemented in a material that is a good diffusion barrier to penetration of species responsible for switching of the resistance.

In some embodiments, the resistance-switching element may be in direct contact with the second electrode.

In some embodiments, the resistance-switching element may be a resistance-switching metal-oxide, such as e.g. $TiO_2$, $HfO_2$, $TaO_2$, $Ta_2O_5$, $Cu_2O$, NiO, ZnO, Perovskite oxides such as $SrTiO_3$, doped $SrZrO_3$, $Pr_{1-x}Ca_xMnO_3$ (PCMO) or any off-stoichiometric derived compounds or silicates or (oxy-)nitrides, or doped dielectrics using dopants such as, e.g. Al, Gd, Sc, Mg, V, Ti.

In some embodiments, the resistance-switching element may include an active dielectric layer and a reactive metal cap-layer or an active dielectric layer that is subjected to a thermal treatment (also referred to as a reducing anneal) after deposition, meant to induce off-stoichiometry, or a combination of active dielectric layers and/or reactive metal cap-layer, which can produce a variable level of off-stoichiometry across the structure. The thermal treatment may be an anneal at a temperature in the range of 250-700° C., in an ambient such as $N_2$, $O_2$, $H_2$, Ar, or any stable combination of the above gases and at a pressure ranging from atmospheric pressure down to low pressures of 1 mTorr or less.

In a memory cell according to some embodiments, the dielectric layers of the multi-layer tunnel stack may comprise or consist of high-k materials, such as e.g. rare earth oxides, $HfO_2$, $Ta_2O_5$, MgO, $Al_2O_3$, $TiO_2$, rare-earth oxides such as $Dy_2O_3$, $Sc_2O_3$, $La_2O_3$, or any off-stoichiometric derived compounds or silicates or (oxy-)nitrides.

In a memory cell according to some embodiments, the resistance-switching element may require a one-time electric forming operation. Alternatively, the resistance-switching element may be forming-free.

The resistance-switching element may change its resistivity across a spatially localized region (also called filamentary switching). Such memory cell may be preferably implemented with an inner conductive layer. Alternatively, the resistance-switching element may change its resistivity across a spatially delocalized region (also called areal or uniform switching, where no filaments are created). Such memory cell may be preferentially implemented without inner conductive layer, but may optionally be implemented with an inner conductive layer.

In a second aspect, the present invention provides an array of memory cells according to any of the embodiments of the first aspect of the present invention.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which.

Figure 1A:
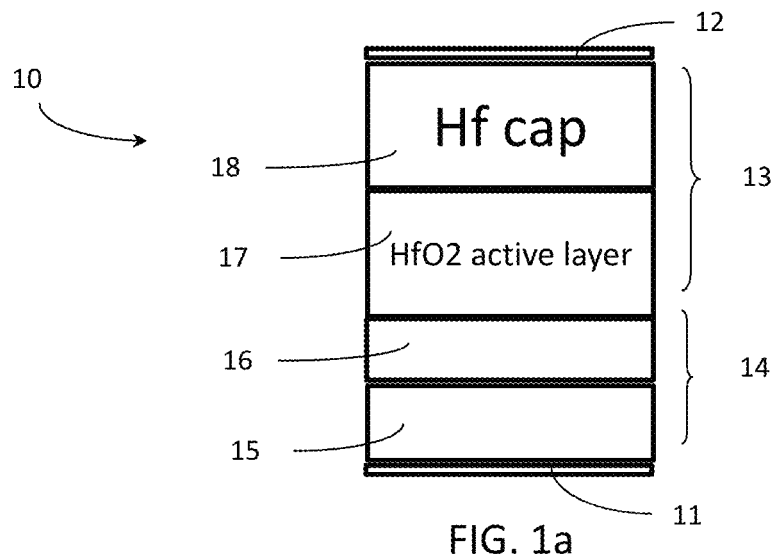
FIG. 1a schematically illustrates a memory cell according to a first embodiment.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, a memory array, which can also be referred to as a memory cell array, refers to an array having a plurality of memory cells that are logically organised in rows and columns. Throughout this description, the terms "horizontal" and "vertical" (related to the terms "row" and "column" respectively) are used to provide a coordinate system and for ease of explanation only. They do not need to, but may, refer to an actual physical direction of the device. Furthermore, the terms "column" and "row" are used to describe sets of array elements which are linked together. A column can sometimes be referred to as a "bitline," and a row can be referred to as a "wordline." However, the designations may be reversed and a column and a row may be referred to as a "wordline" and a "bitline," respectively. The linking can be in the form of a Cartesian array of rows and columns; however, the present invention is not limited thereto. As will be understood by those skilled in the art, columns and rows can be easily interchanged and it is intended in this disclosure that these terms be interchangeable. Also, non-Cartesian arrays may be constructed and are included within the scope of the invention. Accordingly the terms "row" and "column" should be interpreted widely. To facilitate in this wide interpretation, reference is made to "logically organised in rows and columns". By this is meant that sets of memory elements are linked together in a topologically linear intersecting manner; however, that the physical or topographical arrangement need not be so. For example, the rows may be circles and the columns radii of these circles and the circles and radii are described in this invention as "logically organised" rows and columns.

In the context of the present disclosure, a memory array may have a cross-bar architecture. Memory arrays having cross-bar architectures, sometimes called "cross-bar arrays" or "cross-point arrays," have a first plurality of conductive lines (e.g., columns or bit lines) and a second plurality of conductive lines (e.g., rows or wordlines) that cross the first conductive lines. The memory array also includes a plurality of memory cells formed at the intersections of the first and second conductive lines. In some embodiments, a memory cell can have a memory element and a selector element that are connected in series between a bottom electrode and a top electrode. In some embodiments, the selector element can be a rectifying element. As used herein, a rectifying element refers to a switching device that does not have an inner conductive (e.g., metallic) or a semiconducting layer between terminal conducting electrodes. For example, a rectifying element can have a metal-insulator-metal structure, which includes an insulator (e.g., an insulating oxide) formed between metallic terminal electrodes. In some other embodiments, the selector element can include a diode element. As used herein, a diode element refers to a switching device that includes an inner conductive layer, such as a metallic layer, for instance a metal layer or a degenerately doped polysilicon layer. When selected, the selector element (rectifying element or the diode element) can be configured to pass a relatively large amount of current to access (e.g., program, erase, read) the memory element. On the other hand, when inhibited (i.e., unselected), the selector element can be configured to pass a relatively small amount of current. A ratio of the current passing through the selected selector element and the current passing through the inhibited selector element can exceed $1 \times 10^6$, $1 \times 10^4$, or $1 \times 10^3$. Thus, a selector device can be configured to pass the most amount of current through a selected memory element during an access operation (e.g., program, erase, read operations). In its most general form, the rectifying element or diode element may be a separate element electrically connected to the memory element, but in some embodiments, the rectifying element or the diode element is monolithically integrated with the memory element, thus providing a self-rectified or self-selected memory element.

In alternative embodiments, the memory array may be an array of vertical memory cells. A vertical memory cell includes multiple layers that are vertically stacked between a column and a row. Such vertical memory cells are compatible with a rectifying element without inner conductive layer.

As used herein, a memory cell refers to a unit in a memory array, which includes two electrodes, e.g. a bottom electrode and a top electrode, and a memory element and a selector element (e.g., a rectifying element) formed between the top and bottom electrodes. In the memory array, the memory cells are logically organised in rows and columns, which can be wordlines and bitlines, which electrically connect the memory cells through the electrodes.

In the context of the present disclosure, the memory element can be a resistance switching element. A resistance switching element can be a variable resistive element that is formed of a material whose resistance value can be reversibly changed by an external stimulus, such as a voltage or a current. In some embodiments, the resistance switching element may be formed of a bipolar switching material, which can be configured to switch from a low resistance state to a high resistance state under a first polarity and to switch from a high resistance state to a low resistance state under a second polarity opposite to the first polarity. Memory cells having such resistance switching elements are sometimes be referred to as "bipolar memory elements." In some other embodiments, the resistance switching element may be formed of a unipolar switching material, which can be configured to switch from a low resistance state to a high resistance state under a polarity and to switch from a high resistance state to a low resistance state under the same polarity. Memory cells having such resistance switching elements are sometimes be referred to as "unipolar memory cells." In yet some other embodiments, the resistance switching element may be formed of a switching material that can be configured as either a bipolar memory element to form a "bipolar memory cell," or a unipolar memory element to form a "unipolar memory cell."

Examples of a switching material include NiO, $Al_2O_3$, $TaO_2$, $Ta_2O_5$, $TiO_2$, $ZrO_2$, and $HfO_2$, or combinations thereof. In some embodiments, the switching material can be stoichiometric. Alternatively, off-stoichiometric or non-stoichiometric forms such as for instance $NiO_x$, $Al_xO_y$, $TaO_x$, $Ta_xO_y$, $TiO_x$, $ZrO_x$, $HfO_x$, may be used as switching materials, wherein 'x' and 'y' denote the fact that locally (or in most of the volume) the material is off-stoichiometric, which favours filamentary (i.e., a localized) switching, as opposed to an area-homogeneous switching.

As used herein, a tunnel rectifier refers to a rectifier where a rectification effect is produced through tunnelling of charge carriers, e.g., electrons or and/or holes.

Some of the embodiments disclosed herein can be applied to memories such as ReRAM, where a resistance switching element acts as the memory element. This is advantageous because the resistance change memory which is a cross-point type memory array allows stacked three-dimensional integration of bi-dimensional crossbar arrays with a high-speed and low-energy consumption operation and with a large memory capacity.

Examples of methods for changing a resistance value of a memory element include a method in which the resistance value of the memory element is reversibly changed between at least a first value and a second value by changing a polarity of a voltage applied to the memory element, and a method in which the resistance value of the memory element is reversibly changed between at least a first value and a second value by controlling the value and time of a voltage applied to the memory element without changing the polarity of the voltage. The former is called bipolar operation, and the latter is called unipolar operation, as described above.

Bipolar operation is for instance adopted in memories, such as a magnetic random access memory (e.g., spin-torque transfer memory (STTM)), in which a bi-directional current is required in writing the data. It is possible to apply the bipolar operation to the resistance change memory of the invention.

Tunnelling is a quantum mechanical phenomenon in which charge carriers (e.g., electrons and/or holes) tunnel through a potential energy barrier in the presence of an applied bias, e.g. a voltage (bias). The tunnelling current depends exponentially on the material properties such as barrier height and thickness. When a barrier is subjected to a relatively moderate bias such that the tunnelling barrier (e.g., a dielectric layer) has a substantially rectangular or a substantially trapezoidal shape, the resulting tunneling mechanism is referred to as a direct tunneling mechanism. On the other hand, when the barrier is subjected to a relatively high bias such that the tunneling barrier has a substantially triangular shape, the resulting tunneling mechanism is referred to as Fowler-Nordheim (FN) tunneling. Under a direct tunneling condition, a carrier tunnels through substantially an entire thickness of the barrier, whereas under an FN tunneling condition, a carrier tunnels through a partial thickness of the barrier. Without being bound to theory, an ultrathin (e.g., less than about 3 nm) dielectric barrier that direct-tunnels electrons therethrough can pass a relatively higher levels of current density (e.g., current density exceeding about $1\times10^5/cm^2$) compared to a dielectric barrier that FN-tunnels electrons therethrough under an access conduction without suffering damage. Thus, in the following, some embodiments comprise tunnel rectifiers that are configured to tunnel electrons in direct tunneling regime under access conditions.

Figure 1B:
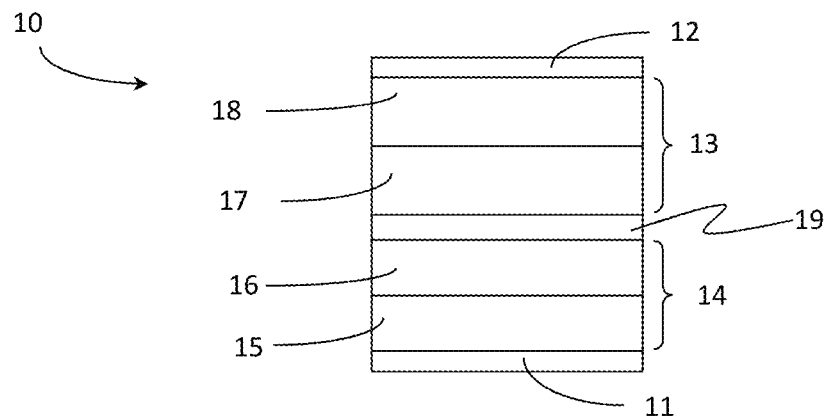
FIG. 1b schematically illustrates a memory cell according to a second embodiment.
Figure 1C:
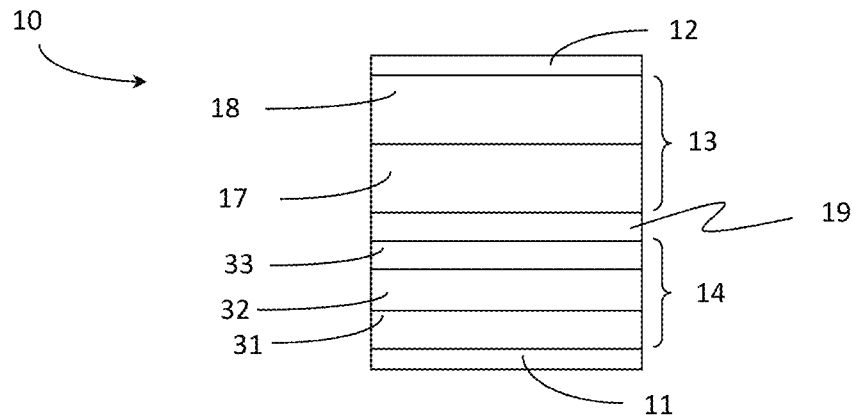
FIG. 1c schematically illustrates a memory cell according to a third embodiment.

FIGS. 1a-1c illustrate memory cells according to various embodiments. A first embodiment of such memory cell 10 is illustrated in FIG. 1a, and comprises a first electrode 11 and a second electrode 12 made of conductive or semiconductive material, for example a bottom electrode and a top electrode, respectively. A resistance switching element 13 is provided between the first electrode 11 and the second electrode 12, and a tunnel rectifier 14 is provided between the resistance-switching element 13 and the first electrode 11. The tunnel rectifier 14 may either be provided between the resistance-switching element 13 and the bottom electrode, or alternatively between the resistance-switching element 13 and the top electrode. In some embodiments, the tunnel rectifier 14 comprises a multi-layer tunnel stack. The multi-layer tunnel stack comprises at least two dielectric layers, layers 15, 16. Each of dielectric layers 15 and 16 has a dielectric constant $k_i$, a conduction band offset $\Phi_i$, and a thickness, wherein one of the layers 15, 16 has a higher dielectric constant $k_i$, a lower conduction band offset $\Phi_i$ and a higher thickness than any of the other dielectric layers $k_j$, $j \neq i$.

As used herein, a conduction band offset $\Phi_i$ of a dielectric film refer to a difference between the conduction band energy of the dielectric material and the highest occupied electron energy level of the nearest source of electrons, e.g., Fermi level of an electron-injecting electrode. For example, referring to the illustrated embodiment of FIG. 1a, in embodiments where the first electrode 11 is configured as the electron injecting electrode, the band offset $\Phi_i$ of the dielectric layer 15 corresponds to a difference between the conduction band energy of the dielectric layer 15 and the Fermi level of the metal of the first electrode 11. In embodiments where the first electrode 11 comprises an n-doped semiconductor, the band offset $\Phi$ of the dielectric layer 15 corresponds to a difference between the conduction band energy of the dielectric layer 15 and the conduction band energy of the semiconductor material of the first electrode 11 Similarly, the band offset $\Phi$ of the dielectric layer 16 corresponds to a difference between the conduction band energy of the dielectric layer 15 and the Fermi level of the metal of the first electrode 11 in embodiments where the first electrode 11 comprises a metal, or a difference between the conduction band energy of the dielectric layer 15 and the conduction band energy of the semiconductor material of the first electrode 11 in embodiments where the first electrode 11 comprises an n-doped semiconductor.

Still referring to FIG. 1a, the higher thickness of the layer with the higher dielectric constant makes it possible to tunnel relatively higher amounts of electrons to change the state of the resistance switching memory element 13. Such higher currents can be advantageous under some circumstances, e.g., when the memory element 13 is a resistive memory element where the switching mechanism is filamentary.

A memory cell 10 according to a further embodiment of the present invention is illustrated in FIG. 1b. All layers are or may be as in the embodiment of FIG. 1a, but the embodiment of FIG. 1b additionally includes a conductive layer 19 between the resistance-switching element 13 and the tunnel rectifier 14. In particular the multi-layer tunnel stack comprises a stack of at least two dielectric layers, layers 15, 16 in the embodiment illustrated, each defined by a dielectric constant $k_i$, a conduction band offset $\Phi_i$, and a thickness, wherein one of the layers 15, 16 has a higher dielectric constant $k_i$, a lower conduction band offset $\Phi_i$ and a higher thickness than any of the other dielectric layers $k_j$, $j \neq i$.

A memory cell 10 according to yet a further embodiment of the present invention is illustrated in FIG. 1c. All layers are as in the embodiment of FIG. 1b, but in the embodiment of FIG. 1c the multi-layer tunnel stack 14 comprises three dielectric layers 31, 32, 33, each defined by a dielectric constant $k_i$, a conduction band offset $\Phi_i$, and a thickness. One of the layers 31, 32, 33 has a higher dielectric constant $k_i$, a lower conduction band offset $\Phi_i$ and a higher thickness than any of the other dielectric layers $k_j$, $j \neq i$. For instance the middle layer 32 of the stack 14 may have a higher dielectric constant, a lower conduction band offset and a higher thickness than both neighbouring layers 31, 33. This higher thickness of an inner layer, for example the middle layer, of the multi-layer tunnel stack 14 makes it possible to tunnel relatively higher amounts of electrons to change the state of the resistance switching memory element 13. Such higher currents can be advantageous under some circumstances, e.g., when the memory element 13 is a resistive memory element where the switching mechanism is filamentary.

As used herein, the embodiment of FIG. 1a is referred to as a selectorless self-rectifying cell, while the embodiments of FIG. 1b and FIG. 1c are referred to as a 1S1R or 1D1R self-rectifying cell or self-selected cell.

In the embodiments illustrated in FIG. 1a, FIG. 1b and FIG. 1c, the resistance switching element 13 not only comprises a resistance switching layer 17 such a for instance a $HfO_2$ active layer, but also a layer 18 of reactive cap material. Without being bound to any theory, during an access operation, the layer 18 of reactive cap material can extract oxygen from the resistance switching layer 17 and generate enough oxygen vacancies (Vo) to initiate a bipolar switching. Under some circumstances, an oxygen vacancy gradient is created in the resistance switching element 13, and the vacancies migrate back and forth within the switching element 13 to switch the memory cell 10 between on (e.g., low resistance) and off (e.g., high resistance) states.

The tunnel rectifier 14 in some embodiments comprises a multi-layer stack of insulating materials that controls a passage current amount in function of the magnitude and polarity of an applied voltage. The rectifying action can be attained based on the so-called tunnel effect. Therefore, if a material is selected to increase an energy difference between the work functions of the electrode material and the conduction band edge of the rectifying insulating material, a more significant rectifying effect can be attained.

The tunnel rectifier 14 in the embodiment illustrated in FIG. 1a and FIG. 1b can include an asymmetric tunnel barrier. As used herein, an asymmetric tunnel barrier refers to a tunnel barrier having tunnelling probabilities through the tunnel rectifier 14 that are significantly different between two opposite tunnelling directions. This means that charge carriers, e.g. electrons, will tunnel differently through the tunnel rectifier 14 although a same voltage level is applied, be it of different polarity. The tunnel rectifier 14 illustrated comprises two dielectric layers 15, 16. The first dielectric layer 15 has a first dielectric constant $k_1$, a first conduction band offset $\Phi_1$ and a first thickness, and the second dielectric layer 16 has a second dielectric constant $k_2$, a second conduction band offset $\Phi_2$ and a second thickness. In accordance with some embodiments, the first dielectric constant $k_1$ may for instance be larger, e.g. at least a factor two larger than the second dielectric constant $k_2$, the first conduction band offset $\Phi_1$ may be smaller, e.g. at least 0.3 eV smaller than the second conduction band offset $\Phi_2$, and the first thickness may be larger, for instance at least 1 nm larger, than the second thickness. The dielectric layer 16 with the lowest value for the dielectric constant, the highest value for the conduction band offset and the lowest thickness is located, in case of embodiments with only two dielectric layers in the tunnel stack 14, closest to the active part, implemented by the resistance switching element 13.

In some the second dielectric layer 16 can have a dielectric constant not exceeding about 12, e.g. between about 4 and about 12, or between about 4 and about 8, or between about 8 and about 12.

In some embodiments, the first dielectric layer 15 can have a dielectric constant, for example, between about 10 and about 200, between about 15 and about 100, or between about 20 and about 50. In some embodiments, the first dielectric layer 15 can have a dielectric constant greater than the dielectric constant of the first dielectric layer 16 by, for example, between about 2× and 20×, between about 3× and about 5×, for instance about 4×.

In accordance with some embodiments, a voltage-induced asymmetry is thus implemented in the memory cell 10, by combining an asymmetric tunnel barrier (the two-layer tunnel rectifier 14) with an active switching stack (comprising the active layer 17 and the reactive cap 18). This way, a rectifying effect is combined with a resistive switching effect in a single physical stack.

In some embodiments, an asymmetric tunnel barrier can be configured as a unidirectional selector element that has a relatively high tunnelling probability of charge carriers (e.g. electrons) in one direction under a first voltage polarity, while having a relatively low tunnelling probability to efficiently block the charge carriers in the opposite direction under a second voltage opposite to the first voltage polarity. In yet some other embodiments, the asymmetric tunnel barrier can advantageously be configured as a diffusion barrier for the species responsible for resistive switching, which may be, for instance (but not limited thereto) oxygen ions or oxygen vacancies.

The tunnel rectifier 14 in the embodiment illustrated in FIG. 1c includes a symmetric tunnel barrier. With symmetric tunnel barrier is meant a stack where the tunnelling properties are similar or the same in both directions, so that the tunnelling probability through the tunnel rectifier 14 is substantially equal or even equal in two directions (from top to bottom or from bottom to top in the orientation as illustrated in FIG. 1c). This means that charge carriers, e.g. electrons, tunnel with similar probabilities through the tunnel rectifier 14 in opposite directions when voltages having similar magnitudes but opposite polarities are applied to the rectifier 14.

Band diagrams of the memory cell 10 according to FIG. 1a in operation are illustrated in FIG. 2(a)-2(c).

In case the tunnel rectifier stack 14 is disposed between the bottom electrode 11 and the resistance switching element 13, the memory element has the structure of FIG. 2(a) before band modulation, and has the structure of FIG. 2(b) or FIG. 2(c) after band modulation, depending on the polarity of the applied voltage.

In case that low or no voltage is applied to the memory cell 10, as illustrated in FIG. 2(a), the current generated by direct tunnelling through the multi-layer tunnel stack 14 is limited or even non-existent.

In case a voltage equal to or larger than a positive threshold voltage is applied as the forward bias, as illustrated in FIG. 2(b), the tunnelling current through the multi-layer tunnel stack 14 is limited by the potential barrier of the stack over most of its physical thickness. The current passing through the memory cell 10 is limited. Even if for positive bias the current increases with positive applied bias, this increase is much smaller as compared to negative applied voltage of identical magnitude.

On the other hand, in case of a negative voltage less than a negative threshold voltage equal to the negative turn-on voltage (i.e. the voltage corresponding to creation of a field which allows carriers to tunnel mostly through the potential energy barrier only shown by the layer 16 of the dielectric stack 14) is applied as a reverse bias to the memory cell 10, as illustrated in FIG. 2(c), significant current is generated by tunnelling through the multi-layer tunnel stack 14. The current passing through the memory cell 10 increases with increasing reverse bias. When the negative applied voltage is between 0 and the negative-turn on voltage, the tunnelling current through the multilayer stack is limited by the potential barrier shown by both layers 15 and 16, as labelled in FIG. 2(a), and is much smaller than when the negative applied voltage is less than the negative threshold voltage, which provides a significant rectification effect.

In some embodiments, the dielectric layer (layer 16 in FIGS. 2(a)-2(c)) of the dielectric layer stack 14 which is in contact with the side where the charge carriers, e.g. the electrons, tunnel from during a write operation, has a lower k-value and a higher band offset $\Phi$ compared to the neighbouring dielectric layer (layer 15 in FIGS. 2(a)-2(c)).

Figure 3:
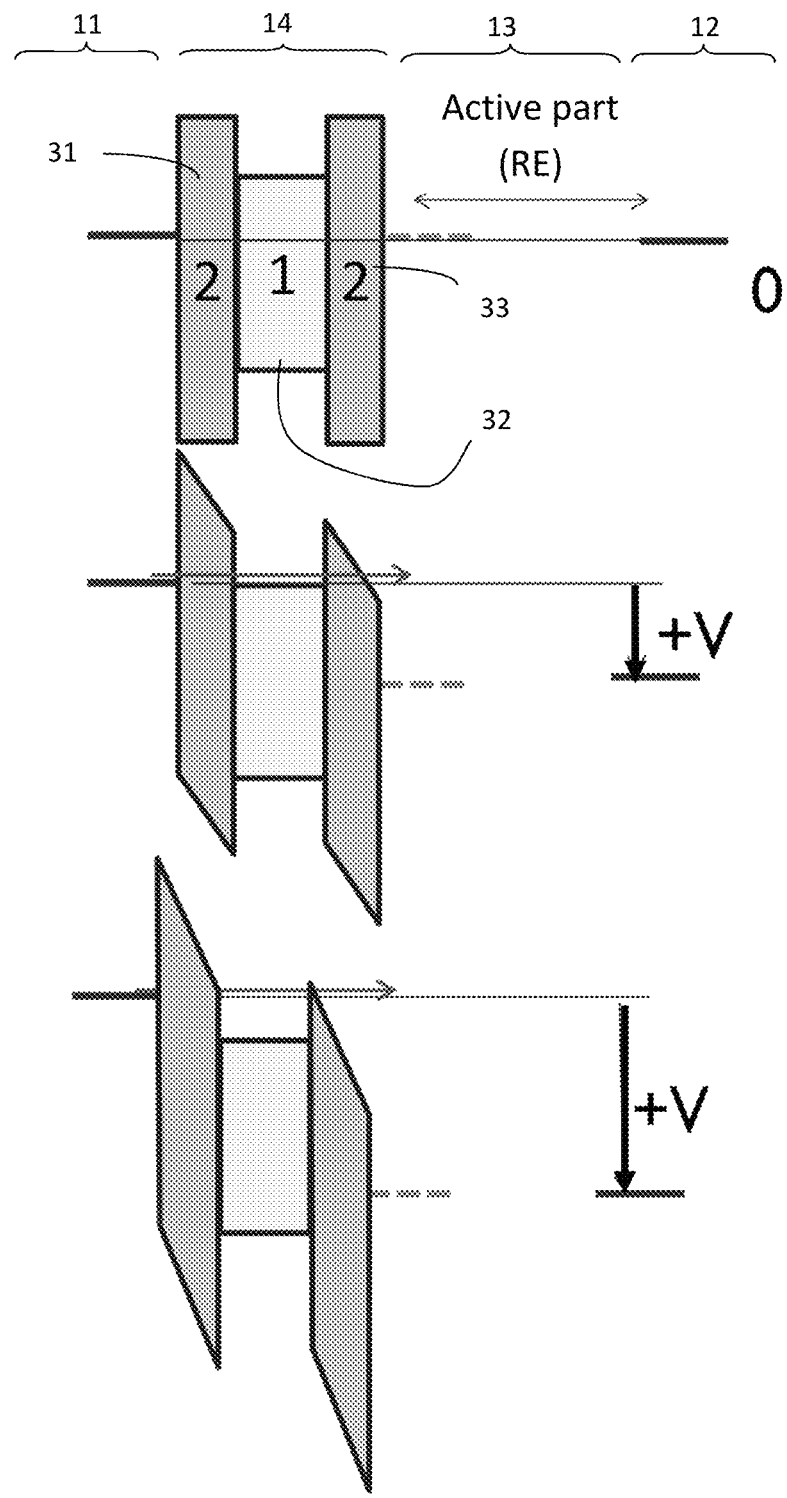
FIG. 3 illustrates electronic band diagrams for a memory cell according to a further embodiment of a memory cell including a symmetrical dielectric stack, under different bias conditions.

In further embodiments, the rectifier tunnel stack may include a symmetric stack, such as for instance a stack comprising three dielectric layers, as illustrated using band diagrams in FIG. 3.

The tunnel rectifier 14 in the embodiment illustrated in FIG. 1c and FIG. 3 is a symmetric tunnel barrier. As used herein, a symmetric tunnel barrier has tunnelling probabilities that are substantially the same in both directions under voltages having similar magnitudes but opposite polarities. This means that charge carriers, e.g. electrons, will tunnel the same way through the tunnel rectifier 14 if a same voltage level is applied, be it of different polarity. The tunnel rectifier 14 illustrated comprises three dielectric layers. The first dielectric layer 31 has a first dielectric constant $k_1$, a first conduction band offset $\Phi_1$ and a first thickness, the second dielectric layer 32 has a second dielectric constant $k_2$, a second conduction band offset $\Phi_2$ and a second thickness, and the third dielectric layer 33 has a third dielectric constant $k_3$, a third conduction band offset $\Phi_3$ and a third thickness. In accordance with some embodiments, the first dielectric constant $k_1$ and the third dielectric constant $k_3$ may for instance be smaller than the second dielectric constant $k_2$, the second conduction band offset $\Phi_2$ may be smaller than the first conduction band offset $\Phi_1$ and the third conduction band offset $\Phi_3$, and the second thickness may be higher than the first and the third thicknesses. Hence the dielectric layer with the highest value $k_2$ for the dielectric constant, the lowest value $\Phi_2$ for the conduction band offset and the highest value for the thickness is located, in case of this embodiment with three or another odd number of dielectric layers, in the middle of the tunnel stack 14.

In some embodiments, the dielectric constants $k_1$ and $k_3$ of the first layer 31 and the third layer 33 may be substantially equal, e.g. less than a factor 2 difference, or even equal to one another. The second dielectric constant $k_2$ may be much larger than the first and third dielectric constants $k_1$ and $k_3$. The first and third conduction band offsets $\Phi_1$ and $\Phi_3$ may be substantially equal, e.g. not more than 0.3 eV difference, or even equal to one another. In particular embodiments, the same materials could be used for the first and third dielectric layers 31, 33. The thicknesses of the first and third layers 31, 33 may be substantially equal, e.g. less than 0.3 nm different, or may even be equal to one another.

In what is explained above, various embodiments are described as if the conduction band offsets $\Phi_1$, $\Phi_2$, $\Phi_3$ would be constant over the thickness of the dielectric layers 31, 32, 33. In reality, however, this is an idealization. The values to be compared are the average values over one layer, e.g. the average second conduction band offset $\Phi_2$ should be smaller than the average first conduction band offset $\Phi_1$ and the average third conduction band offset $\Phi_3$.

In particular embodiments, the layers 31, 33 with the smaller dielectric constant $k_1$, $k_3$ could for instance have a dielectric constant of not more than 12, for instance between about 4 and about 12, or between about 4 and about 8, or between about 8 and about 12, such as, for example MgO, $Al_2O_3$, $Si_3N_4$, $SiO_2$, or any derived compounds or silicates or (oxy)nitrides. Both layers 31 and 33 can have a dielectric constant with the same value, or both dielectric constants can be not more than 12, e.g. can fall between about 4 and about 12, or between about 4 and about 8, or between about 8 and about 12.

Figure 2:
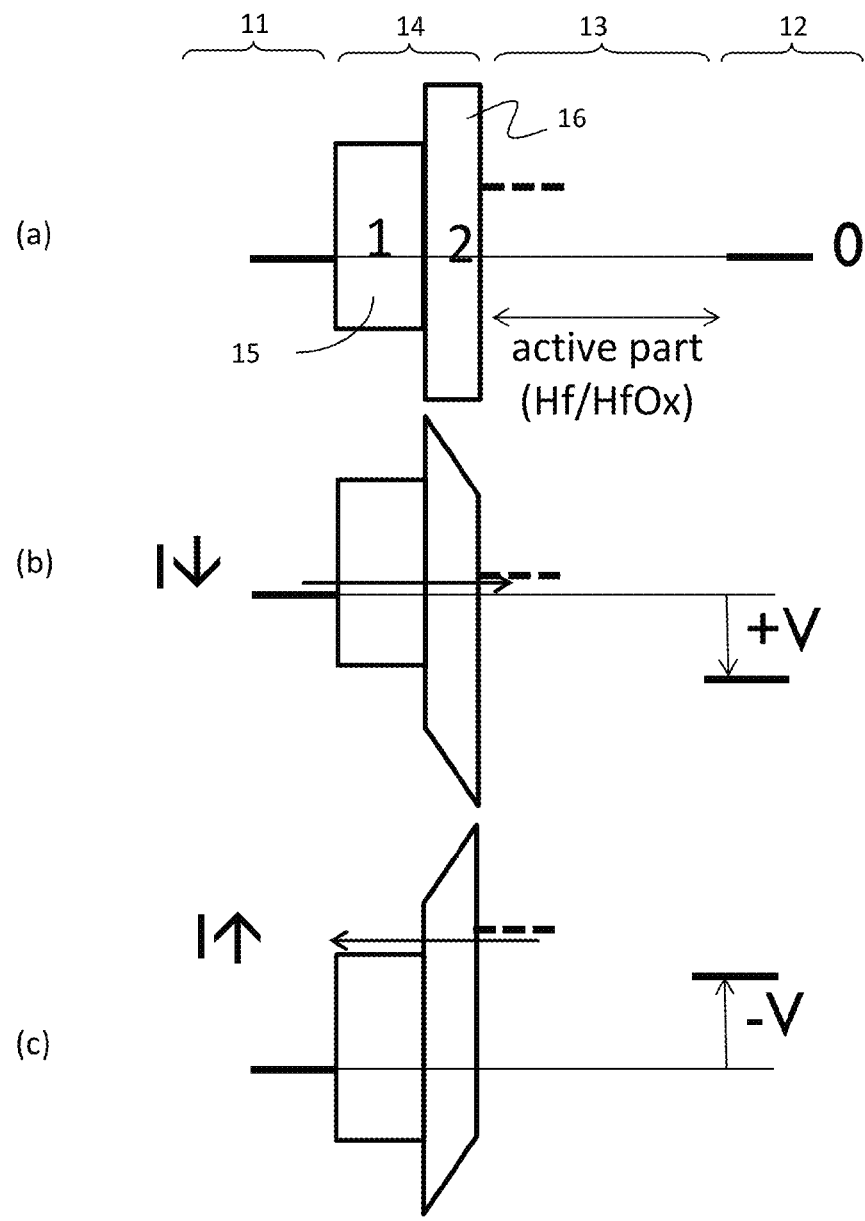
FIGS. 2(a)-2(c) illustrates electronic band diagrams for the memory cell of FIG. 1a under different bias conditions.

As materials for the first dielectric layer 15 in the embodiment of FIG. 1a, FIG. 1b and FIG. 2, or for the second dielectric layer 32 in the embodiment of FIG. 1c and FIG. 3 commercial high-k materials can be used such as for instance $HfO_2$, $Ta_2O_5$, $TiO_2$, rare-earth oxides such as $Dy_2O_3$, $Sc_2O_3$, $La_2O_3$, or any derived compounds such as aluminates or silicates or (oxy-) nitrides, having no or limited density of electrically-active defects. The dielectric layers should have as little defects as possible. MgO, with a k-value of around 8 to 10, may for instance be used for the second dielectric layer 16 or the first and third dielectric layers 31, 33. In some embodiments, the second dielectric layer 32 can have a dielectric constant, for example, between about 10 and about 200, between about 15 and about 100, or between about 20 and about 50. In some embodiments, the second dielectric layer 32 can have a dielectric constant greater than the dielectric constant of the first dielectric layer 31 and/or the third dielectric layer 33 by, for example, between about 2x and 20x, between about 3x and about 5x, for instance about 4x.

Figure 4:
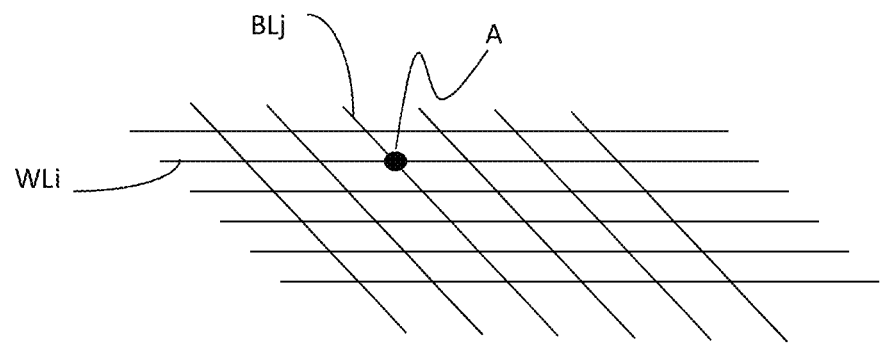
FIG. 4 schematically illustrates an array of memory cells according to some embodiments.

A cross-point array is schematically illustrated in FIG. 4, with memory cells logically organised in rows and columns, at cross points between a set of word lines and a set of bit lines, according to some embodiments. The word lines may for instance be arranged along rows of the array, and the bit lines may for instance be arranged along columns of the array. Each memory cell is associated with one word line and with one bit line. In the example schematically illustrated in FIG. 4, memory cell A is associated with world line $WL_i$ running over it, and bit line $BL_j$ running underneath it. In order to have current running through a particular memory cell A, its associated word line $WL_i$ and bit line $BL_j$ have an applied voltage of −V/2 and +V/2, respectively. All other bitlines and wordlines are unselected and are set at a voltage equal to 0. Memory cells associated with the same word line $WL_i$ and a bitline different from $BL_j$ are subjected to a voltage drop V/2, and other memory cells associated with bit line $BL_j$ and a wordline different from $WL_j$ see a voltage drop V/2, which is not sufficient to activate the memory cell, i.e. to allow current passing through it. The particular memory cell A, which is intended to be addressed (for example, for read-out or for programming operation) however, associated with both word line $WL_i$ and bit line $BL_j$, is subjected to a voltage V over it, which is sufficient to have current passing through it. However, if the memory cell A is in a high resistive state, a low current should be read. If other memory cells are in a low resistive state, a sneak path could be formed, and a high current could be read. This is especially true if we do not have nonlinearity (rectification) in the memory cells.

It can now be shown that nonlinearity is improved with memory cells according to some embodiments, comprising a rectifying insulating film, optionally a conductive layer and a variable resistance film.

Design

When designing a memory cell according to some embodiments, exemplary material properties, such as for instance material type and layer thickness, are selected for each of the layers of the rectifying stack. This stack can then be simulated so as to establish its IV-characteristics, using a two-terminal, diode configuration. If the memory cell is a bipolar cell, a bidirectional rectifying characteristics such as that shown in FIG. 5 on a linear scale is obtained. Important values for such memory cell are the turn-on voltages, i.e. the voltage at which the current begins to flow through the device, and the level of the read current 50 and the write current 51. In the example illustrated, the turn-on voltage is about 1 V. The current density levels are compatible with μA-write current at 10 nm cell size. There is a non-linearity factor of about 2 decades, and some IV-asymmetry is possible.

Figure 5:
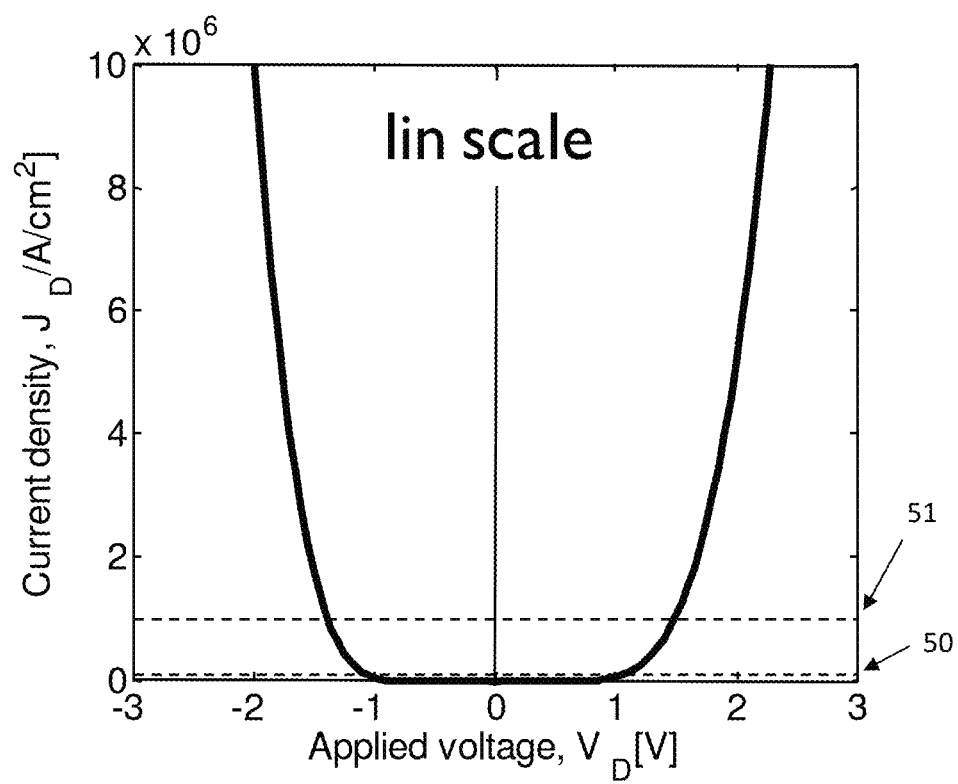
FIG. 5 illustrates an IV-characteristic of a bidirectional rectifying stack according to some embodiments, displayed on a linear scale.
Figure 6:
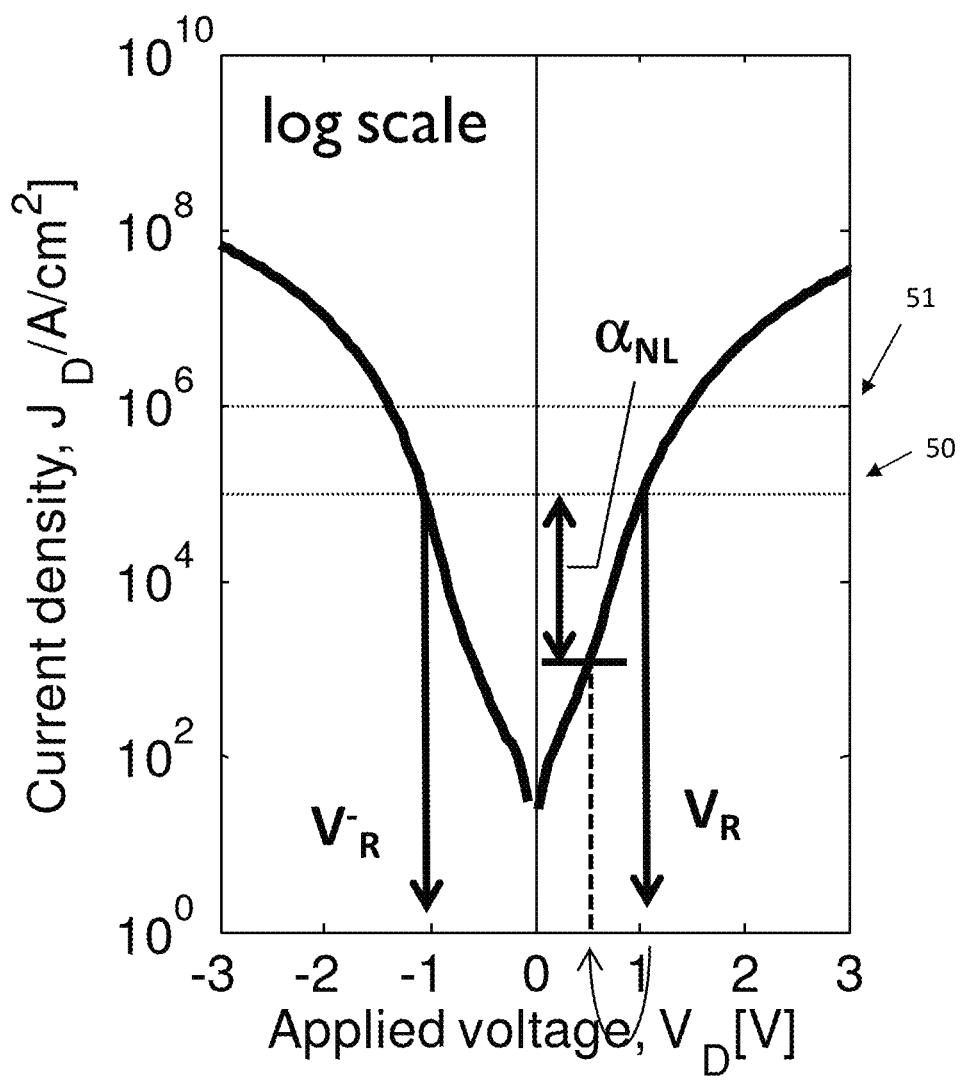
FIG. 6 illustrates the IV-characteristic of the bidirectional rectifying stack of FIG. 5, displayed on a logarithmic scale.

In order to determine the above values, for better visibility and discernability, the IV characteristic of FIG. 5 may be represented on a logarithmic scale, meaning that a graph as illustrated in FIG. 6 is obtained.

A target current density $J_{target}$ is predefined for assessing the nonlinearity (rectification ability). This is the current density 50 corresponding to a particular read current which is desired to be used for reading out the memory cell. The read-out voltage(s) corresponding to this target current density $1_{target}$ is (are) determined in the IV-characteristic, and is the applied voltage $V_D$ at which the current $1_D$ corresponds to the target current density $1_{target}$:

$$V_R = V_D|_{1_D = 1_{target}}$$

In the example illustrated, which is a bipolar embodiment, two read-out voltages are found: $V_R$ and $V^{-R}$, corresponding to read-out voltages of about +1V and −1V, respectively.

Next, a non-linearity factor $\alpha_{NL}$ is determined, which is the distance, on the logarithmic scale, between the current level at the switch-on voltage $V_R$ and the current at half the switch-on voltage $V_R/2$:

$$\alpha_{NL} = \log\left(\frac{J_{D,target}(V_R)}{J(V_R/2)}\right)$$

The larger the non-linearity factor, the better the self-rectifying effect of the memory cell, i.e. the less chance that a memory cell in an array of memory cells gets read out when it shouldn't. It is desired to obtain a memory cell structure with a non-linearity factor of about 2 decades or more.

This may be obtained by tuning the multi-layer tunnel stack 14, more particularly the types and dimensions of materials. Selecting a sequence of materials with dielectric constants and conduction band offsets as in the present invention proves to lead to good non-linearity results.

Now in accordance with some embodiments, the tunnel stack rectifier 14 is designed so as to enhance the non-linearity, while keeping similar switch-on voltages $V_R$ and optionally (for bipolar functioning) $V_R^-$.

Figure 7:
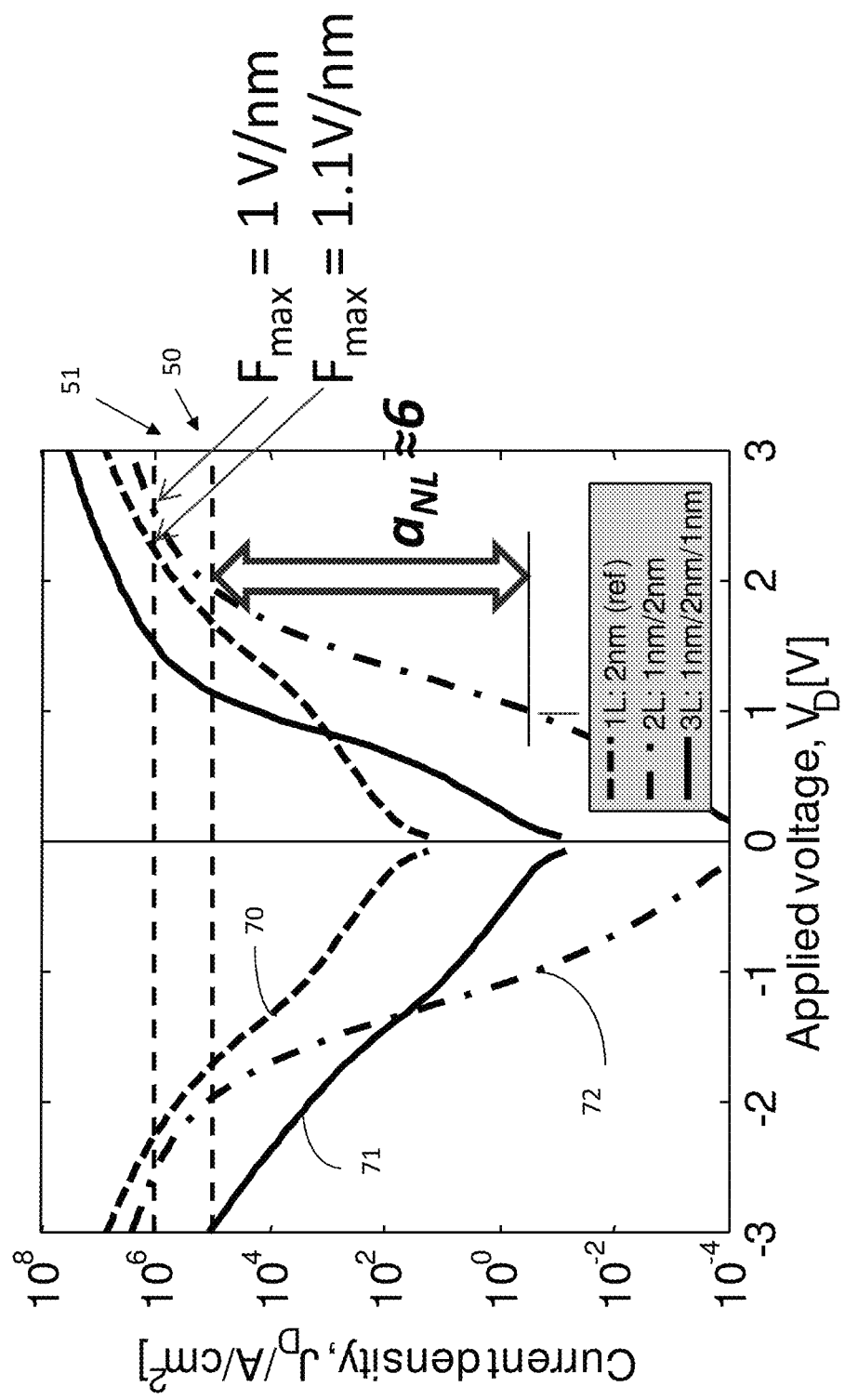
FIG. 7 illustrates IV-characteristics corresponding to a single-layer tunnel rectifier/diode, a two-layer stack tunnel rectifier/diode according to a first embodiment and a three-layer stack tunnel rectifier/diode according to a further.

It has been shown that a large improvement of the non-linearity region can be obtained with some embodiments—see FIG. 7. Three graphs are illustrated: graph 70 illustrating the results of a prior art reference memory cell with a single layer dielectric, graph 71 illustrating the results of a memory cell according to a first embodiment of the present invention with a double layer dielectric stack, and graph 72 illustrating the results of a memory cell according to a second embodiment of the present invention with a triple layer dielectric stack.

In the embodiments illustrated, the material parameters are as follows:

By way of an example, a double layer stack with a first layer having a first dielectric constant $k_1$, a first conduction band offset $\Phi_1$ and a first thickness $t_1$, and a second layer having a second dielectric constant $k_2$, a second conduction band offset $\Phi_1$ and a second thickness $t_2$ can have (graph 71):

Conduction band offset: $\Phi_1$=1.2 eV; $\Phi_2$=0.8 eV
Dielectric constants: $k_1$=8; $k_2$=30
Thickness: $t_1$=1 nm; $t_2$=2 nm By way of an example, a triple layer stack with a first layer having a first dielectric constant $k_1$, a first conduction band offset $\Phi_1$ and a first thickness $t_1$, a second layer having a second dielectric constant $k_2$, a second conduction band offset $\Phi_2$ and a second thickness $t_2$, and a third layer having a third dielectric constant $k_3$, a third conduction band offset $\Phi_3$ and a third thickness $t_3$, the second layer being sandwiched between the first and the third layer can have (graph 72):

Conduction band offset: $\Phi_1$=$\Phi_3$=1.2 eV; $\Phi_2$=0.8 eV
Dielectric constants: $k_1$=$k_3$=8; $k_2$=30
Thickness: $t_1$=$t_3$=1 nm; $t_2$=2 nm It can be seen from FIG. 7 that the non-linearity region is larger in case of the embodiment with a layer stack comprising two dielectric layers compared to the case where a single dielectric layer is provided, and that the non-linearity region is still much larger in the embodiment where the stack comprises three dielectric layers. In this particular embodiment, there are nearly six orders of magnitude nonlinearity at half-select read voltage.

Nevertheless, the applied voltage and maximum electric field $F_{max}$ through the dielectrics of the stack, when reaching the target current, are not very different between the embodiment with a layer stack comprising three dielectric layers and the case where a single dielectric layer is provided (Fmax=1 V/nm vs. Fmax=1.1 V/nm).

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

What is claimed is:

1. A memory cell comprising:
a first electrode and a second electrode formed of one of a metallic material or a semiconducting material;
a resistance-switching element formed between the first electrode and the second electrode;
a tunnel rectifier formed between and in physical contact with the resistance-switching element and the first electrode, wherein the tunnel rectifier comprises a multi-layer tunnel stack comprising at least two dielectric layers each having a dielectric constant ($k_i$), a conduction band offset ($\Phi_i$), and a thickness, and wherein the resistance-switching element is configured to switch between a low resistance state and a high resistance state in response to electrons tunneling through the tunnel rectifier,
wherein one of the dielectric layers has a higher dielectric constant, a lower conduction band offset and a higher thickness compared to any other dielectric layer of the multi-layer tunnel stack, wherein the dielectric constant of one of the dielectric layers does not exceed 12 and a dielectric constant of another one of the dielectric layers is between about 20 and about 50,
wherein the multi-layer tunnel stack is a stack of three dielectric layers, wherein a dielectric layer is sandwiched between a first neighboring dielectric layer and a second neighboring dielectric layer and has:
a dielectric constant ($k_2$) that is higher than dielectric constants of the first and second neighboring dielectric layers ($k_2$>$k_1$ and $k_2$>$k_3$);
a conduction band offset ($\Phi_2$) that is lower than conduction band offsets of the first and second neighboring dielectric layers ($\Phi_2$<$\Phi_1$ and $\Phi_2$<$\Phi_3$); and
a thickness ($t_2$) that is higher than thicknesses of the first and second neighboring dielectric layers ($t_2$>$t_1$ and $t_2$>$t_3$).

2. The memory cell according to claim 1, wherein the memory cell is a bipolar memory cell configured to switch from a low resistance state to a high resistance state under a first polarity and to switch from a high resistance state to a low resistance state under a second polarity opposite to the first polarity.

3. The memory cell according to claim 1, wherein the first and second neighboring dielectric layers have substantially similar conduction band offsets.

4. The memory cell according to claim 1, wherein ratios of the dielectric constant ($k_2$) of the sandwiched dielectric layer to the dielectric constants ($k_1$, $k_3$) of the first and second neighboring dielectric layers are between about 3 and about 5.

5. The memory device of claim 4, wherein each of the dielectric constants ($k_1$, $k_3$) of the first and second neighboring dielectric layers is between about 8 and about 10, and wherein the dielectric constant ($k_2$) of the sandwiched dielectric layer is between about 20 and about 50.

6. The memory device of claim 5, wherein each of the first and second neighboring dielectric layers is formed of MgO.

7. The memory cell according to claim 1, wherein the first neighboring dielectric layer is in direct contact with the first electrode.

8. The memory cell according to claim 1, wherein the multi-layer tunnel stack comprises a substantially symmetric stack, wherein the first and second neighboring dielectric layers have substantially similar dielectric constants, conduction band offsets and thicknesses.

9. The memory cell according to claim 1, wherein the multi-layer tunnel stack comprises a substantially asymmetric stack, wherein the first and second neighboring dielectric layers have substantially different dielectric constants, conduction band offsets and thicknesses.

10. The memory cell according to claim 1, wherein the resistive switching element further comprises an inner conductive layer, wherein a dielectric layer of the multi-layer tunnel stack contacts the inner conductive layer.

11. The memory cell according to claim 10, where the inner conductive layer forms a diffusion barrier configured to block diffusion of atoms or ions associated with switching of the resistance-switching element.

12. The memory cell according to claim 1, wherein at least one of the dielectric layers of the multi-layer tunnel stack layer forms a diffusion barrier configured to block diffusion of atoms or ions associated with switching of the resistance-switching element through the at least one of the dielectric layers.

13. The memory cell according to claim 1, wherein the resistance-switching element includes an active dielectric layer and a reactive metal cap-layer.

14. The memory cell according to claim 1, wherein the resistance-switching element is configured to switch without a forming operation.

15. The memory cell according to claim 1, wherein the resistance-switching element changes its resistance across a spatially localized region within the resistance-switching element.

16. The memory cell according to claim 1, wherein the thickness of the one of the at least two dielectric layers is between about 1.8 nm and about 3.5 nm.

17. A memory device comprising:
a first conductive line extending in a first direction;
a second conductive line extending in a second direction;
a memory cell formed at an intersection of the first and second conductive lines, wherein the memory cell comprises a memory element and a selector element interposed between a first electrode and a second electrode,
wherein the memory element is configured to switch from a high resistance state to a low resistance state under a first switching condition including a first voltage magnitude and a first polarity and is further configured to switch from a low resistance state to a high resistance state under a second switching condition including a second voltage magnitude and a second polarity opposite to the first polarity,
wherein the selector element consists of two or three dielectric layers, wherein each layer of the selector element is formed of a material different from the memory element, and
wherein the two or three dielectric layers have:
a first dielectric layer having a first thickness, a first dielectric constant not exceeding 12 and a first conduction band offset, and
a second dielectric layer on the first dielectric layer and having a second thickness greater than the first thickness, a second dielectric constant between about 20 and about 50 and a second conduction band offset lower than the first conduction band offset,
such that the selector element has a ratio of a first current density at a first voltage ($V_R$) across the selector element and a second current density at a second voltage across the selector element that is 50% of the first voltage ($V_R/2$) that exceeds about five decades.

18. The memory device of claim 17, wherein the second thickness is greater than the first thickness by at least about 1 nm, wherein the second dielectric constant is greater than the first dielectric constant by between about 3× and about 5×, and wherein the second conduction band offset is lower than the first conduction band offset by at least about 0.3 eV.

19. The memory device of claim 18, wherein the selector element further comprises a third dielectric layer on the second dielectric layer, wherein the third dielectric layer is substantially equal in thickness to the first dielectric layer such that the selector element is further configured to tunnel electrons through the entire thickness of the third dielectric under an erase access condition.

20. A memory cell comprising:
a first electrode and a second electrode formed of one of a metallic material or a semiconducting material;
a resistance-switching element formed between the first electrode and the second electrode;
a tunnel rectifier formed between and in physical contact with the resistance-switching element and the first electrode, wherein the tunnel rectifier comprises a multi-layer tunnel stack comprising at least two dielectric layers each having a dielectric constant ($k_i$), a conduction band offset ($\Phi_i$), and a thickness, and wherein the resistance-switching element is configured to switch between a low resistance state and a high resistance state in response to electrons tunneling through the tunnel rectifier,
wherein the multi-layer tunnel layer stack consists of two or three dielectric layers, wherein each layer of the multi-layer tunnel stack is formed of a material different from the resistance-switching element,
wherein one of the dielectric layers has a higher dielectric constant, a lower conduction band offset and a higher thickness compared to any other dielectric layer of the multi-layer tunnel stack, wherein the dielectric constant of one of the dielectric layers does not exceed 12 and a dielectric constant of another one of the dielectric layers is between about 20 and about 50.

* * * * *

UNITED STATES PATENT AND TRADEMARK OFFICE
CERTIFICATE OF CORRECTION

PATENT NO. : 9,595,668 B2  
APPLICATION NO. : 14/306116  
DATED : March 14, 2017  
INVENTOR(S) : Bogdan Govoreanu Page 1 of 1

It is certified that error appears in the above-identified patent and that said Letters Patent is hereby corrected as shown below:

In the Specification

In Column 1 at Line 53, change "A/cm2" insert --A/cm$^2$.--.

In Column 14 at Line 37, change "discernability," to --discernibility,--.

In Column 14 at Lines 45, 47, and 48, change "target current density $l_{target}$" to --target current density $J_{target}$--.

In Column 14 at Line 46, change "$l_D$" to --$J_D$--.

In Column 14 at Line 51 (approx.), change "$V^{-R}$," to --$V_R^-$,--.

In the Claims

In Column 16 at Line 33, In Claim 1, change "($\Phi_2$-$\Phi_1$" to --($\Phi_2$<$\Phi_1$--.

In preambles of Claims 5, 6, 18 and 19, change "memory device" to --memory cell--.

Signed and Sealed this  
Twenty-fourth Day of October, 2017

Joseph Matal  
*Performing the Functions and Duties of the*  
*Under Secretary of Commerce for Intellectual Property and*  
*Director of the United States Patent and Trademark Office*